United States Patent
Choy et al.

(10) Patent No.: US 8,248,185 B2
(45) Date of Patent: Aug. 21, 2012

(54) ACOUSTIC RESONATOR STRUCTURE COMPRISING A BRIDGE

(75) Inventors: John Choy, Westminster, CO (US); Chris Feng, Fort Collins, CO (US); Phil Nikkel, Loveland, CO (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 265 days.

(21) Appl. No.: 12/490,525

(22) Filed: Jun. 24, 2009

(65) Prior Publication Data

US 2010/0327697 A1 Dec. 30, 2010

(51) Int. Cl.
- *H03H 9/15* (2006.01)
- *H03H 9/13* (2006.01)
- *H03H 9/52* (2006.01)
- *H03H 9/54* (2006.01)

(52) U.S. Cl. ........ 333/187; 333/189; 310/322; 310/324; 310/365

(58) Field of Classification Search .......... 333/187–192; 310/322, 324, 334, 335, 365
See application file for complete search history.

(56) References Cited

U.S. PATENT DOCUMENTS

| | | |
|---|---|---|
| 3,174,122 A | 3/1965 | Fowler et al. |
| 3,189,851 A | 6/1965 | Fowler |
| 3,321,648 A | 5/1967 | Kolm |
| 3,422,371 A | 1/1969 | Poirier et al. |
| 3,568,108 A | 3/1971 | Poirier et al. |
| 3,582,839 A | 6/1971 | Pim et al. |
| 3,590,287 A | 6/1971 | Berlincourt et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandli et al. |
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |
| 4,344,004 A | 8/1982 | Okubo |
| 4,355,408 A | 10/1982 | Scarrott |
| 4,456,850 A | 6/1984 | Inoue et al. |
| 4,529,904 A | 7/1985 | Hattersley |
| 4,608,541 A | 8/1986 | Moriwaki et al. |
| 4,625,138 A | 11/1986 | Ballato |
| 4,640,756 A | 2/1987 | Wang et al. |
| 4,719,383 A | 1/1988 | Wang et al. |
| 4,769,272 A | 9/1988 | Byrne et al. |

(Continued)

FOREIGN PATENT DOCUMENTS

DE 10160617 6/2003

(Continued)

OTHER PUBLICATIONS

Machine Translation of JP 2007-295306 published Nov. 8, 2007.*

(Continued)

*Primary Examiner* — Barbara Summons (57) ABSTRACT

An acoustic resonator comprises a first electrode a second electrode and a piezoelectric layer disposed between the first and second electrodes. The acoustic resonator further comprises a reflective element disposed beneath the first electrode, the second electrode and the piezoelectric layer. An overlap of the reflective element, the first electrode, the second electrode and the piezoelectric layer comprises an active area of the acoustic resonator. The acoustic resonator also comprises a bridge adjacent to a termination of the active area of the acoustic resonator.

20 Claims, 7 Drawing Sheets

U.S. PATENT DOCUMENTS

| | | | |
|---|---|---|---|
| 4,798,990 A | 1/1989 | Henoch |
| 4,819,215 A | 4/1989 | Yokoyama et al. |
| 4,836,882 A | 6/1989 | Ballato |
| 4,841,429 A | 6/1989 | McClanahan et al. |
| 4,906,840 A | 3/1990 | Zdeblick et al. |
| 5,048,036 A | 9/1991 | Scifres et al. |
| 5,048,038 A | 9/1991 | Brennan et al. |
| 5,066,925 A | 11/1991 | Freitag |
| 5,075,641 A | 12/1991 | Weber et al. |
| 5,111,157 A | 5/1992 | Komiak |
| 5,118,982 A | 6/1992 | Inoue et al. |
| 5,129,132 A | 7/1992 | Zdeblick et al. |
| 5,162,691 A | 11/1992 | Mariani et al. |
| 5,166,646 A | 11/1992 | Avanic et al. |
| 5,185,589 A | 2/1993 | Krishnaswamy et al. |
| 5,214,392 A | 5/1993 | Kobayashi et al. |
| 5,233,259 A | 8/1993 | Krishnaswamy et al. |
| 5,241,209 A | 8/1993 | Sasaki |
| 5,241,456 A | 8/1993 | Marcinkiewicz et al. |
| 5,262,347 A | 11/1993 | Sands |
| 5,270,492 A | 12/1993 | Fukui |
| 5,294,898 A | 3/1994 | Dworsky et al. |
| 5,361,077 A | 11/1994 | Weber |
| 5,382,930 A | 1/1995 | Stokes et al. |
| 5,384,808 A | 1/1995 | Van Brunt et al. |
| 5,448,014 A | 9/1995 | Kong et al. |
| 5,465,725 A | 11/1995 | Seyed-Bolorforosh |
| 5,475,351 A | 12/1995 | Uematsu et al. |
| 5,548,189 A | 8/1996 | Williams |
| 5,567,334 A | 10/1996 | Baker et al. |
| 5,587,620 A | 12/1996 | Ruby et al. |
| 5,589,858 A | 12/1996 | Kadowaki et al. |
| 5,594,705 A | 1/1997 | Connor et al. |
| 5,603,324 A | 2/1997 | Oppelt et al. |
| 5,633,574 A | 5/1997 | Sage |
| 5,671,242 A | 9/1997 | Takiguchi et al. |
| 5,692,279 A | 12/1997 | Mang et al. |
| 5,704,037 A | 12/1997 | Chen |
| 5,705,877 A | 1/1998 | Shimada |
| 5,714,917 A | 2/1998 | Ella |
| 5,729,008 A | 3/1998 | Blalock et al. |
| 5,789,845 A | 8/1998 | Wadaka et al. |
| 5,835,142 A | 11/1998 | Nakamura et al. |
| 5,853,601 A | 12/1998 | Krishaswamy et al. |
| 5,864,261 A | 1/1999 | Weber |
| 5,866,969 A | 2/1999 | Shimada et al. |
| 5,872,493 A | 2/1999 | Ella |
| 5,873,153 A | 2/1999 | Ruby et al. |
| 5,873,154 A | 2/1999 | Ylilammi et al. |
| 5,894,184 A | 4/1999 | Furuhashi et al. |
| 5,894,647 A | 4/1999 | Lakin |
| 5,910,756 A | 6/1999 | Ella |
| 5,932,953 A | 8/1999 | Drees et al. |
| 5,936,150 A | 8/1999 | Kobrin et al. |
| 5,953,479 A | 9/1999 | Zhou et al. |
| 5,955,926 A | 9/1999 | Uda et al. |
| 5,962,787 A | 10/1999 | Okada et al. |
| 5,969,463 A | 10/1999 | Tomita |
| 5,982,297 A | 11/1999 | Welle |
| 6,001,664 A | 12/1999 | Swirhun et al. |
| 6,016,052 A | 1/2000 | Vaughn |
| 6,040,962 A | 3/2000 | Kanazawa et al. |
| 6,051,907 A | 4/2000 | Ylilammi |
| 6,060,818 A | 5/2000 | Ruby et al. |
| 6,087,198 A | 7/2000 | Panasik |
| 6,090,687 A | 7/2000 | Merchant et al. |
| 6,107,721 A | 8/2000 | Lakin |
| 6,111,341 A | 8/2000 | Hirama |
| 6,111,480 A | 8/2000 | Iyama et al. |
| 6,114,795 A | 9/2000 | Tajima et al. |
| 6,118,181 A | 9/2000 | Merchant et al. |
| 6,124,678 A | 9/2000 | Bishop et al. |
| 6,124,756 A | 9/2000 | Yaklin et al. |
| 6,131,256 A | 10/2000 | Dydyk et al. |
| 6,150,703 A | 11/2000 | Cushman et al. |
| 6,187,513 B1 | 2/2001 | Katakura |
| 6,198,208 B1 | 3/2001 | Yano et al. |
| 6,215,375 B1 | 4/2001 | Larson, III et al. |
| 6,219,032 B1 | 4/2001 | Rosenberg et al. |
| 6,219,263 B1 | 4/2001 | Wuidart |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,262,637 B1 | 7/2001 | Bradley et al. |
| 6,263,735 B1 | 7/2001 | Nakatani et al. |
| 6,265,246 B1 | 7/2001 | Ruby et al. |
| 6,278,342 B1 | 8/2001 | Ella |
| 6,284,121 B1 | 9/2001 | Reid |
| 6,292,336 B1 | 9/2001 | Horng et al. |
| 6,306,755 B1 | 10/2001 | Zheng |
| 6,307,447 B1 | 10/2001 | Barber et al. |
| 6,307,761 B1 | 10/2001 | Nakagawa |
| 6,335,548 B1 | 1/2002 | Roberts et al. |
| 6,355,498 B1 | 3/2002 | Chan et al. |
| 6,366,006 B1 | 4/2002 | Boyd |
| 6,376,280 B1 | 4/2002 | Ruby et al. |
| 6,377,137 B1 | 4/2002 | Ruby |
| 6,384,697 B1 | 5/2002 | Ruby |
| 6,396,200 B2 | 5/2002 | Misu et al. |
| 6,407,649 B1 | 6/2002 | Tikka et al. |
| 6,414,569 B1 | 7/2002 | Nakafuku |
| 6,420,820 B1 | 7/2002 | Larson, III |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Shibata |
| 6,441,539 B1 | 8/2002 | Kitamura et al. |
| 6,441,702 B1 | 8/2002 | Ella et al. |
| 6,462,631 B2 | 10/2002 | Bradley et al. |
| 6,466,105 B1 | 10/2002 | Lobl et al. |
| 6,466,418 B1 | 10/2002 | Horng et al. |
| 6,469,597 B2 | 10/2002 | Ruby et al. |
| 6,469,909 B2 | 10/2002 | Simmons |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 | 11/2002 | Larson, III et al. |
| 6,486,751 B1 | 11/2002 | Barber et al. |
| 6,489,688 B1 | 12/2002 | Baumann et al. |
| 6,492,883 B2 | 12/2002 | Liang et al. |
| 6,496,085 B2 | 12/2002 | Ella et al. |
| 6,498,604 B1 | 12/2002 | Jensen |
| 6,507,983 B1 | 1/2003 | Ruby et al. |
| 6,515,558 B1 | 2/2003 | Ylilammi |
| 6,518,860 B2 | 2/2003 | Ella et al. |
| 6,525,996 B1 | 2/2003 | Miyazawa |
| 6,528,344 B2 | 3/2003 | Kang |
| 6,530,515 B1 | 3/2003 | Glenn et al. |
| 6,534,900 B2 | 3/2003 | Aigner et al. |
| 6,542,055 B1 | 4/2003 | Frank et al. |
| 6,548,942 B1 | 4/2003 | Panasik |
| 6,548,943 B2 | 4/2003 | Kaitila et al. |
| 6,549,394 B1 | 4/2003 | Williams |
| 6,550,664 B2 | 4/2003 | Bradley et al. |
| 6,559,487 B1 | 5/2003 | Kang et al. |
| 6,559,530 B2 | 5/2003 | Hinzel et al. |
| 6,564,448 B1 | 5/2003 | Oura et al. |
| 6,566,956 B2 | 5/2003 | Ohnishi et al. |
| 6,566,979 B2 | 5/2003 | Larson, III et al. |
| 6,580,159 B1 | 6/2003 | Fusaro et al. |
| 6,583,374 B2 | 6/2003 | Knieser et al. |
| 6,583,688 B2 | 6/2003 | Klee et al. |
| 6,593,870 B2 | 7/2003 | Dummermuth et al. |
| 6,594,165 B2 | 7/2003 | Duerbaum et al. |
| 6,600,390 B2 | 7/2003 | Frank |
| 6,601,276 B2 | 8/2003 | Barber |
| 6,603,182 B1 | 8/2003 | Low et al. |
| 6,617,249 B2 | 9/2003 | Ruby et al. |
| 6,617,750 B2 | 9/2003 | Dummermuth et al. |
| 6,617,751 B2 | 9/2003 | Sunwoo et al. |
| 6,621,137 B1 | 9/2003 | Ma et al. |
| 6,630,753 B2 | 10/2003 | Malik et al. |
| 6,635,509 B1 | 10/2003 | Ouellet |
| 6,639,872 B1 | 10/2003 | Rein |
| 6,651,488 B2 | 11/2003 | Larson, III et al. |
| 6,657,363 B1 | 12/2003 | Aigner |

| | | |
|---|---|---|
| 6,668,618 B2 | 12/2003 | Larson, III et al. |
| 6,670,866 B2 | 12/2003 | Ella et al. |
| 6,677,929 B2 | 1/2004 | Gordon et al. |
| 6,693,500 B2 | 2/2004 | Yang et al. |
| 6,710,508 B2 | 3/2004 | Ruby et al. |
| 6,710,681 B2 | 3/2004 | Figueredo et al. |
| 6,713,314 B2 | 3/2004 | Wong et al. |
| 6,714,102 B2 | 3/2004 | Ruby et al. |
| 6,720,844 B1 | 4/2004 | Lakin |
| 6,720,846 B2 | 4/2004 | Iwashita et al. |
| 6,724,266 B2 | 4/2004 | Plazza et al. |
| 6,738,267 B1 | 5/2004 | Navas Sabater et al. |
| 6,750,593 B2 | 6/2004 | Iwata |
| 6,774,746 B2 | 8/2004 | Whatmore et al. |
| 6,777,263 B1 | 8/2004 | Gan et al. |
| 6,787,048 B2 | 9/2004 | Bradley et al. |
| 6,788,170 B1 | 9/2004 | Kaitila et al. |
| 6,803,835 B2 | 10/2004 | Frank |
| 6,812,619 B1 | 11/2004 | Kaitila et al. |
| 6,820,469 B1 | 11/2004 | Adkins et al. |
| 6,828,713 B2 | 12/2004 | Bradley et al. |
| 6,842,088 B2 | 1/2005 | Yamada et al. |
| 6,842,089 B2 | 1/2005 | Lee |
| 6,849,475 B2 * | 2/2005 | Kim .............................. 438/50 |
| 6,853,534 B2 | 2/2005 | Williams |
| 6,861,920 B2 | 3/2005 | Ishikawa et al. |
| 6,872,931 B2 | 3/2005 | Liess et al. |
| 6,873,065 B2 | 3/2005 | Haigh et al. |
| 6,873,529 B2 | 3/2005 | Ikuta |
| 6,874,211 B2 | 4/2005 | Bradley et al. |
| 6,874,212 B2 | 4/2005 | Larson, III |
| 6,888,424 B2 | 5/2005 | Takeuchi et al. |
| 6,900,705 B2 | 5/2005 | Nakamura et al. |
| 6,903,452 B2 | 6/2005 | Ma et al. |
| 6,906,451 B2 | 6/2005 | Yamada et al. |
| 6,911,708 B2 | 6/2005 | Park |
| 6,917,261 B2 | 7/2005 | Unterberger |
| 6,924,583 B2 | 8/2005 | Lin et al. |
| 6,924,717 B2 | 8/2005 | Ginsburg et al. |
| 6,927,651 B2 | 8/2005 | Larson, III et al. |
| 6,936,837 B2 | 8/2005 | Yamada et al. |
| 6,936,928 B2 | 8/2005 | Hedler et al. |
| 6,936,954 B2 | 8/2005 | Peczalski |
| 6,941,036 B2 | 9/2005 | Lucero |
| 6,943,647 B2 | 9/2005 | Aigner |
| 6,943,648 B2 | 9/2005 | Maiz et al. |
| 6,946,928 B2 | 9/2005 | Larson et al. |
| 6,954,121 B2 | 10/2005 | Bradley et al. |
| 6,963,257 B2 | 11/2005 | Ella et al. |
| 6,970,365 B2 | 11/2005 | Turchi |
| 6,975,183 B2 | 12/2005 | Aigner et al. |
| 6,977,563 B2 | 12/2005 | Komuro et al. |
| 6,985,051 B2 | 1/2006 | Nguyen et al. |
| 6,985,052 B2 | 1/2006 | Tikka |
| 6,987,433 B2 | 1/2006 | Larson et al. |
| 6,989,723 B2 | 1/2006 | Komuro et al. |
| 6,998,940 B2 | 2/2006 | Metzger |
| 7,002,437 B2 | 2/2006 | Takeuchi et al. |
| 7,019,604 B2 | 3/2006 | Gotoh et al. |
| 7,019,605 B2 | 3/2006 | Larson, III |
| 7,026,876 B1 | 4/2006 | Esfandiari et al. |
| 7,053,456 B2 | 5/2006 | Matsuo |
| 7,057,476 B2 | 6/2006 | Hwu |
| 7,057,478 B2 | 6/2006 | Korden et al. |
| 7,064,606 B2 | 6/2006 | Louis |
| 7,084,553 B2 | 8/2006 | Ludwiczak |
| 7,091,649 B2 | 8/2006 | Larson, III et al. |
| 7,098,758 B2 | 8/2006 | Wang et al. |
| 7,102,460 B2 | 9/2006 | Schmidhammer et al. |
| 7,109,826 B2 * | 9/2006 | Ginsburg et al. ............ 333/187 |
| 7,128,941 B2 | 10/2006 | Lee |
| 7,129,806 B2 | 10/2006 | Sato |
| 7,138,889 B2 | 11/2006 | Lakin |
| 7,148,466 B2 | 12/2006 | Eckman et al. |
| 7,158,659 B2 | 1/2007 | Baharav et al. |
| 7,161,448 B2 | 1/2007 | Feng et al. |
| 7,170,215 B2 | 1/2007 | Namba et al. |
| 7,173,504 B2 | 2/2007 | Larson |
| 7,187,254 B2 | 3/2007 | Su et al. |
| 7,209,374 B2 | 4/2007 | Noro |
| 7,212,083 B2 | 5/2007 | Inoue et al. |
| 7,212,085 B2 | 5/2007 | Wu |
| 7,230,509 B2 | 6/2007 | Stoemmer |
| 7,230,511 B2 | 6/2007 | Onishi et al. |
| 7,233,218 B2 | 6/2007 | Park et al. |
| 7,242,270 B2 | 7/2007 | Larson et al. |
| 7,259,498 B2 | 8/2007 | Nakatsuka et al. |
| 7,268,647 B2 * | 9/2007 | Sano et al. .................... 333/187 |
| 7,275,292 B2 | 10/2007 | Ruby et al. |
| 7,276,994 B2 | 10/2007 | Takeuchi et al. |
| 7,280,007 B2 | 10/2007 | Feng et al. |
| 7,281,304 B2 | 10/2007 | Kim et al. |
| 7,294,919 B2 | 11/2007 | Bai |
| 7,301,258 B2 | 11/2007 | Tanaka |
| 7,310,861 B2 | 12/2007 | Aigner et al. |
| 7,313,255 B2 | 12/2007 | Machida et al. |
| 7,332,985 B2 | 2/2008 | Larson et al. |
| 7,345,410 B2 | 3/2008 | Grannen et al. |
| 7,358,831 B2 | 4/2008 | Larson et al. |
| 7,367,095 B2 | 5/2008 | Larson, III et al. |
| 7,368,857 B2 | 5/2008 | Tanaka |
| 7,369,013 B2 | 5/2008 | Fazzio et al. |
| 7,385,467 B2 | 6/2008 | Stoemmer et al. |
| 7,388,318 B2 | 6/2008 | Yamada et al. |
| 7,388,454 B2 | 6/2008 | Ruby et al. |
| 7,388,455 B2 | 6/2008 | Larson, III |
| 7,391,286 B2 | 6/2008 | Jamneala et al. |
| 7,400,217 B2 | 7/2008 | Larson, III et al. |
| 7,408,428 B2 | 8/2008 | Larson, III |
| 7,414,349 B2 | 8/2008 | Sasaki |
| 7,414,495 B2 | 8/2008 | Iwasaki et al. |
| 7,420,320 B2 | 9/2008 | Sano et al. |
| 7,423,503 B2 | 9/2008 | Larson, III |
| 7,425,787 B2 | 9/2008 | Larson, III |
| 7,439,824 B2 | 10/2008 | Aigner |
| 7,463,118 B2 | 12/2008 | Jacobsen |
| 7,466,213 B2 | 12/2008 | Lobl et al. |
| 7,482,737 B2 * | 1/2009 | Yamada et al. ............... 310/363 |
| 7,508,286 B2 | 3/2009 | Ruby et al. |
| 7,515,018 B2 | 4/2009 | Handtmann et al. |
| 7,535,324 B2 | 5/2009 | Fattinger et al. |
| 7,545,532 B2 | 6/2009 | Muramoto |
| 7,561,009 B2 | 7/2009 | Larson, III et al. |
| 7,567,023 B2 | 7/2009 | Iwaki et al. |
| 7,576,471 B1 | 8/2009 | Solal |
| 7,602,101 B2 * | 10/2009 | Hara et al. ..................... 310/320 |
| 7,619,493 B2 | 11/2009 | Uno et al. |
| 7,629,865 B2 | 12/2009 | Ruby |
| 7,655,963 B2 | 2/2010 | Sadaka et al. |
| 7,684,109 B2 | 3/2010 | Godshalk et al. |
| 7,714,684 B2 | 5/2010 | Ruby et al. |
| 7,768,364 B2 | 8/2010 | Hart et al. |
| 7,795,781 B2 | 9/2010 | Barber et al. |
| 7,889,024 B2 | 2/2011 | Bradley et al. |
| 8,008,993 B2 | 8/2011 | Milsom et al. |
| 8,084,919 B2 | 12/2011 | Nishihara et al. |
| 2002/0000646 A1 | 1/2002 | Gooch et al. |
| 2002/0030424 A1 | 3/2002 | Iwata |
| 2002/0063497 A1 | 5/2002 | Panasik |
| 2002/0070463 A1 | 6/2002 | Chang et al. |
| 2002/0121944 A1 | 9/2002 | Larson, III et al. |
| 2002/0121945 A1 | 9/2002 | Ruby et al. |
| 2002/0126517 A1 | 9/2002 | Matsukawa et al. |
| 2002/0140520 A1 | 10/2002 | Hikita et al. |
| 2002/0152803 A1 | 10/2002 | Larson, III et al. |
| 2002/0190814 A1 | 12/2002 | Yamada et al. |
| 2003/0001251 A1 | 1/2003 | Cheever et al. |
| 2003/0006502 A1 | 1/2003 | Karpman |
| 2003/0011285 A1 | 1/2003 | Ossmann |
| 2003/0011446 A1 | 1/2003 | Bradley |
| 2003/0051550 A1 | 3/2003 | Nguyen et al. |
| 2003/0087469 A1 | 5/2003 | Ma |
| 2003/0102776 A1 | 6/2003 | Takeda et al. |
| 2003/0111439 A1 | 6/2003 | Fetter et al. |
| 2003/0128081 A1 | 7/2003 | Ella et al. |
| 2003/0132493 A1 | 7/2003 | Kang et al. |
| 2003/0132809 A1 | 7/2003 | Senthilkumar et al. |
| 2003/0141946 A1 | 7/2003 | Ruby et al. |

| | | |
|---|---|---|
| 2003/0179053 A1 | 9/2003 | Aigner et al. |
| 2003/0205948 A1 | 11/2003 | Lin et al. |
| 2004/0016995 A1 | 1/2004 | Kuo et al. |
| 2004/0017130 A1 | 1/2004 | Wang et al. |
| 2004/0056735 A1 | 3/2004 | Nomura et al. |
| 2004/0092234 A1 | 5/2004 | Pohjonen |
| 2004/0099898 A1 | 5/2004 | Grivna et al. |
| 2004/0124952 A1 | 7/2004 | Tikka |
| 2004/0150293 A1 | 8/2004 | Unterberger |
| 2004/0150296 A1 | 8/2004 | Park et al. |
| 2004/0166603 A1 | 8/2004 | Carley et al. |
| 2004/0195937 A1 | 10/2004 | Matsubara et al. |
| 2004/0212458 A1 | 10/2004 | Lee |
| 2004/0246075 A1 | 12/2004 | Bradley et al. |
| 2004/0257171 A1 | 12/2004 | Park et al. |
| 2004/0257172 A1 | 12/2004 | Schmidhammer et al. |
| 2004/0263287 A1 | 12/2004 | Ginsburg et al. |
| 2005/0012570 A1 | 1/2005 | Korden et al. |
| 2005/0012716 A1 | 1/2005 | Mikulin et al. |
| 2005/0023931 A1 | 2/2005 | Bouche et al. |
| 2005/0030126 A1 | 2/2005 | Inoue et al. |
| 2005/0036604 A1 | 2/2005 | Scott et al. |
| 2005/0057117 A1 | 3/2005 | Nakatsuka et al. |
| 2005/0057324 A1 | 3/2005 | Onishi et al. |
| 2005/0068124 A1 | 3/2005 | Stoemmer |
| 2005/0093396 A1 | 5/2005 | Larson, III et al. |
| 2005/0093653 A1 | 5/2005 | Larson, III |
| 2005/0093654 A1 | 5/2005 | Larson, III et al. |
| 2005/0093655 A1 | 5/2005 | Larson, III et al. |
| 2005/0093657 A1 | 5/2005 | Larson, III et al. |
| 2005/0093658 A1 | 5/2005 | Larson, III et al. |
| 2005/0093659 A1 | 5/2005 | Larson, III et al. |
| 2005/0104690 A1 | 5/2005 | Larson et al. |
| 2005/0110598 A1 | 5/2005 | Larson, III |
| 2005/0128030 A1 | 6/2005 | Larson, III et al. |
| 2005/0140466 A1 | 6/2005 | Larson, III et al. |
| 2005/0167795 A1 | 8/2005 | Higashi |
| 2005/0193507 A1 | 9/2005 | Ludwiczak |
| 2005/0206271 A1 | 9/2005 | Higuchi et al. |
| 2005/0206479 A1 | 9/2005 | Nguyen et al. |
| 2005/0206483 A1 | 9/2005 | Pashby et al. |
| 2005/0218488 A1 | 10/2005 | Matsuo |
| 2005/0248232 A1* | 11/2005 | Itaya et al. .................. 310/320 |
| 2005/0269904 A1* | 12/2005 | Oka ........................... 310/324 |
| 2006/0017352 A1 | 1/2006 | Tanielian |
| 2006/0071736 A1 | 4/2006 | Ruby et al. |
| 2006/0081048 A1 | 4/2006 | Mikado et al. |
| 2006/0087199 A1 | 4/2006 | Larson, III et al. |
| 2006/0103492 A1 | 5/2006 | Feng et al. |
| 2006/0119453 A1 | 6/2006 | Fattinger et al. |
| 2006/0125489 A1 | 6/2006 | Feucht et al. |
| 2006/0132262 A1 | 6/2006 | Fazzio et al. |
| 2006/0164183 A1 | 7/2006 | Tikka et al. |
| 2006/0164186 A1 | 7/2006 | Stoemer et al. |
| 2006/0185139 A1 | 8/2006 | Larson, III et al. |
| 2006/0197411 A1 | 9/2006 | Hoen et al. |
| 2006/0238070 A1 | 10/2006 | Costa et al. |
| 2006/0284707 A1 | 12/2006 | Larson et al. |
| 2006/0290446 A1 | 12/2006 | Aigner et al. |
| 2007/0035364 A1 | 2/2007 | Sridhar et al. |
| 2007/0037311 A1 | 2/2007 | Izumi et al. |
| 2007/0080759 A1 | 4/2007 | Jamneala et al. |
| 2007/0085447 A1 | 4/2007 | Larson, III |
| 2007/0085631 A1 | 4/2007 | Larson, III et al. |
| 2007/0085632 A1 | 4/2007 | Larson, III et al. |
| 2007/0086080 A1 | 4/2007 | Larson, III et al. |
| 2007/0086274 A1 | 4/2007 | Nishimura et al. |
| 2007/0090892 A1 | 4/2007 | Larson, III |
| 2007/0170815 A1 | 7/2007 | Unkrich |
| 2007/0171002 A1 | 7/2007 | Unkrich |
| 2007/0176710 A1 | 8/2007 | Jamneala et al. |
| 2007/0205850 A1 | 9/2007 | Jamneala et al. |
| 2007/0279153 A1 | 12/2007 | Ruby |
| 2007/0291164 A1 | 12/2007 | Goh et al. |
| 2008/0055020 A1 | 3/2008 | Handtmann |
| 2008/0129417 A1 | 6/2008 | Taniguchi |
| 2008/0143215 A1* | 6/2008 | Hara et al. .................. 310/328 |
| 2008/0258842 A1 | 10/2008 | Ruby et al. |
| 2008/0297278 A1 | 12/2008 | Handtmann et al. |
| 2008/0297279 A1 | 12/2008 | Thalhammer et al. |
| 2008/0297280 A1 | 12/2008 | Thalhammer et al. |
| 2009/0064498 A1 | 3/2009 | Mok et al. |
| 2009/0079302 A1* | 3/2009 | Wall et al. .................. 310/365 |
| 2009/0096550 A1 | 4/2009 | Handtmann et al. |
| 2009/0127978 A1 | 5/2009 | Asai et al. |
| 2009/0153268 A1 | 6/2009 | Milson et al. |
| 2009/0201594 A1 | 8/2009 | Smith |
| 2010/0052176 A1 | 3/2010 | Kamada et al. |
| 2010/0052815 A1 | 3/2010 | Bradley et al. |
| 2010/0091370 A1 | 4/2010 | Mahrt et al. |
| 2010/0102358 A1 | 4/2010 | Lanzieri et al. |
| 2010/0148637 A1 | 6/2010 | Satou |
| 2010/0176899 A1 | 7/2010 | Schaufele et al. |
| 2010/0187948 A1 | 7/2010 | Sinha et al. |
| 2010/0260453 A1 | 10/2010 | Block |
| 2010/0327697 A1 | 12/2010 | Choy et al. |
| 2010/0327994 A1 | 12/2010 | Choy et al. |
| 2011/0084779 A1 | 4/2011 | Zhang |

FOREIGN PATENT DOCUMENTS

| | | |
|---|---|---|
| DE | 10239317 | 3/2004 |
| DE | 102007012384 | 3/2007 |
| EP | 231892 | 8/1987 |
| EP | 0637875 | 2/1995 |
| EP | 637875 | 2/1995 |
| EP | 689254 | 12/1995 |
| EP | 0865157 | 9/1998 |
| EP | 880227 | 11/1998 |
| EP | 973256 | 1/2000 |
| EP | 0973256 | 1/2000 |
| EP | 1047189 | 10/2000 |
| EP | 1096259 | 5/2001 |
| EP | 1100196 | 5/2001 |
| EP | 1180494 | 2/2002 |
| EP | 1249932 | 10/2002 |
| EP | 1258989 | 11/2002 |
| EP | 1258990 | 11/2002 |
| EP | 1517443 | 3/2005 |
| EP | 1517444 | 3/2005 |
| EP | 1528674 | 5/2005 |
| EP | 1528675 | 5/2005 |
| EP | 1528676 | 5/2005 |
| EP | 1528677 | 5/2005 |
| EP | 1542362 | 6/2005 |
| EP | 1557945 | 7/2005 |
| EP | 1575165 | 9/2005 |
| EP | 2299592 | 12/2009 |
| EP | 2299593 | 3/2011 |
| FR | 2951027 | 10/2009 |
| GB | 1207974 | 10/1970 |
| GB | 2013343 | 8/1979 |
| GB | 2411239 | 8/2005 |
| GB | 2418791 | 4/2006 |
| GB | 2427773 | 1/2007 |
| JP | 59023612 | 2/1984 |
| JP | 61054686 | 3/1986 |
| JP | 62-109419 | 5/1987 |
| JP | 62-200813 | 9/1987 |
| JP | 1-295512 | 11/1989 |
| JP | 2-10907 | 1/1990 |
| JP | 06005944 | 1/1994 |
| JP | 8-330878 | 12/1996 |
| JP | 09-027729 | 1/1997 |
| JP | 9-83029 | 3/1997 |
| JP | 10-32456 | 2/1998 |
| JP | 2000-31552 | 1/2000 |
| JP | 2000-232334 | 8/2000 |
| JP | 2000-295065 | 10/2000 |
| JP | 2001-102901 | 4/2001 |
| JP | 2001-508630 | 6/2001 |
| JP | 2002/217676 | 8/2002 |
| JP | 2002217676 | 8/2002 |
| JP | 2003/017964 | 1/2003 |
| JP | 2003017964 | 1/2003 |
| JP | 2003-505905 | 2/2003 |
| JP | 2003/124779 | 4/2003 |
| JP | 2003124779 | 4/2003 |
| JP | 2003-332872 | 11/2003 |

| | | |
|---|---|---|
| JP | 2006-109472 | 4/2006 |
| JP | 2006-295924 | 10/2006 |
| JP | 2006-319796 | 11/2006 |
| JP | 2007-006501 | 1/2007 |
| JP | 2007/028669 | 2/2007 |
| JP | 2007-295306 * | 11/2007 |
| JP | 2008-066792 * | 3/2008 |
| WO | WO-98/16957 | 4/1998 |
| WO | WO-98/38736 | 9/1998 |
| WO | WO-98/56049 | 12/1998 |
| WO | WO-99/37023 | 7/1999 |
| WO | WO-99-37023 | 7/1999 |
| WO | WO-01/06646 | 1/2001 |
| WO | WO-01/06647 | 1/2001 |
| WO | WO-01/99276 | 12/2001 |
| WO | WO-02/103900 | 12/2002 |
| WO | WO-03/030358 | 4/2003 |
| WO | WO-03/043188 | 5/2003 |
| WO | WO-03/050950 | 6/2003 |
| WO | WO-03/058809 | 7/2003 |
| WO | WO-2004/034579 | 4/2004 |
| WO | WO-2004/051744 | 6/2004 |
| WO | WO-2004/102688 | 11/2004 |
| WO | WO-2005/043752 | 5/2005 |
| WO | WO-2005/043753 | 5/2005 |
| WO | WO-2005/043756 | 5/2005 |
| WO | WO-2006/018788 | 2/2006 |

OTHER PUBLICATIONS

Al-Ahmad, M. et al., "Piezoelectric-Based Tunable Microstrip Shunt Resonator", *Proceedings of Asia-Pacific Microwave Conference* 2006.

U.S. Appl. No. 10/971,169, filed Oct. 22, 2004, Larson III, John D., et al.

Aoyama, Takayuki et al., "Diffusion of Boron, Phosphorous, Arsenic and Antimony in Thermally Grown SiliconDioxide", *Journal of the Electrochemical Society*, vol. 146, No. 5 1999, 1879-1883.

Auld, B. A., "Acoustic Resonators", *Acoustic Fields and Waves in Solids*, Second Edition, vol. II 1990, 250-259.

Bauer, L. O. et al., "Properties of Silicon Implanted with Boron Ions through Thermal Silicon Dioxide", *Solid State Electronics*, vol. 16, No. 3 Mar. 1973, 289-300.

Choi, Sungjin et al., "Design of Half-Bridge Piezo-Transformer Converters in the AC Adapter Applications", *IEEE 2005*, 244-248.

Coombs, Clyde F., "Electronic Instrument Handbook", *Second Edition, McGraw-Hill, Inc.* 1995, pp. 5.1 to 5.29.

Fattinger, G. G. et al., "Coupled Bulk Acoustic Wave Resonator Filters: Key technology for single-to-balanced RF filters", 0/7803-8331-1/4/W20.00: *IEEE MTT-S Digest* 2004, 927-929.

Hadimioglu, B. et al., ""Polymer Films As Acoustic Matching Layers".", *1990 IEEE Ultrasonics Symposium Proceedings*, vol. 3 PP. [Previously submitted as "Polymer Files As Acoustic Matching Layers, 1990 IEEE Ultrasonics Symposium Proceeding. vol. 4 PP. 1227-1340, Dec. 1990". Considered by Examiner on Mar. 20, 2007, 337-1340.

Hara, K., "Surface Treatment of Quartz Oscillator Plate by Ion Implantation", *Oyo Buturi*, vol. 47, No. 2 Feb. 1978, 145-146.

Holzlohner, Ronald et al., "Accurate Calculation of Eye Diagrams and Bit Error Rates in Optical Transmission Systems Using Linearization", *Journal of Lightwave Technology*, vol. 20, No. 3, Mar. 2002, pp. 389-400.

Ivensky, Gregory et al., "A Comparison of Piezoelectric Transformer AC/DC Converters with Current Doubler and voltage Doubler Rectifiers", *IEEE Transactions on Power Electronics*, vol. 19, No. 6. Nov. 2004.

Jiang, Yimin et al., "A Novel Single-Phase Power Factor Correction Scheme", *IEEE* 1993, 287-292.

Jung, Jun-Phil et al., "Experimental and Theoretical Investigation on the Relationship Between AlN Properties and AlN-Based FBAR Characteristics", *2003 IEEE International Frequency Control Symposium and PDA Exhibition Jointly with the 17th European Frequency and Time Forum* Sep. 3, 2003, 779-784.

Krishnaswamy, S.V. et al., "Film Bulk Acoustic Wave Resonator Technology", May 29, 1990, 529-536.

Lakin, K.M., "Bulk Acoustic Wave Coupled Resonator Filters", *2002 IEEE International Frequency Control Symposium and PDA Exhibition* Jan. 2, 2002, 8-14.

Lakin, K.M., "Coupled Resonator Filters", *2002 IEEE Ultrasonics Symposium* Mar. 2, 2002, 901-908.

Lakin, K.M. et al., "High Performance Stacked Crystal Filters for GPS and Wide Bandwidth Applications", *2001 IEEE Ultrasonics Symposium* Jan. 1, 2001, 833-838.

Lakin, K. M. et al., "Temperature Compensated Bulk Acoustic Thin Film Resonators", *IEEE Ultrasonics Symposium*, San Juan, Puerto Rico Oct. 2000, 855-858.

Lakin, K.M., "Thin Film BAW Filters for Wide Bandwidth and High Performance Applications", *IEEE Microwave Symposium Digest*; vol. 2 Jun. 6-11, 2004, 923-926.

Lakin, K. M., "Thin Film Resonators and Filters", *IEEE Untrasonics Symposium, Caesar's Tahoe*, NV Oct. 1999, 895-906.

Lakin, et al., "Wide Bandwidth Thin Film BAW Filters", *2004 IEEE Ultrasonics Symposium*, vol. 1, Aug. 2004, 407-410.

Larson III, John D. et al., "Measurement of Effective Kt2,Q,Rp,Rs vs. Temperature for Mo/AlN FBAR Resonators", *IEEE Ultrasonics Symposium* 2002, 939-943.

Li, Yunxiu et al., "AC-DC Converter with Worldwide Range Input Voltage by Series and Parallel Piezoelectric Transformer Connection", *35th Annual IEEE Power Electronics Specialists Conference* 2004.

Lobl, H.P. et al., "Piezoelectric Materials for BAW Resonators and Filters", *2001 IEEE Ultrasonics Symposium* Jan. 1, 2001, 807-811.

Martin, Steven J. et al., "Development of a Low Dielectric Constant Polymer for the Fabrication of Integrated Circuit Interconnect", *12 Advanced Materials* Dec. 23, 2000, 1769-1778.

Navas, J. et al., "Miniaturised Battery Charger using Piezoelectric Transformers", *IEEE* 2001, 492-496.

Ng, J. et al., "The Diffusion Ion-Implanted Boron in Silicon Dioxide", *AIP Conf. Proceedings*, No. 122 1984, 20-33.

Ohta, S. et al., "Temperature Characteristics of Solidly Mounted Piezoelectric Thin Film Resonators", *IEEE Ultrasonics Symposium*, Honolulu, HI Oct. 2003, 2011-2015.

Pang, W. et al., "High Q Single-Mode High-Tone Bulk Acoustic Resonator Integrated With Surface-Machined FBAR Filter", *Microwave Symposium Digest, IEEE MTT-S International* 2005, 413-416.

Parker, T. E. et al., "Temperature-Compensated Surface Acoustic-Wave Devices with SiO2 Film Overlays", *J. Appl. Physics*, vol. 50 1360-1369, Mar. 1979.

Reinhardt, Alexandre et al., "Design of Coupled Resonator Filters Using Admittance and Scattering Matrices", *2003 IEEE Ultrasonics Symposium* May 3, 2003, 1428-1431.

Ruby, R. C., "MicroMachined Thin Film Bulk Acoustic Resonators", *IEEE International Frequency Control Symposium* 1994, 135-138.

Ruby, R. et al., "The Effect of Perimeter Geometry on FBAR Resonator Electrical Performance", *Microwave Symposium Digest, 2005 IEEE MTT-S International* Jun. 12, 2005, 217-221.

Sanchez, A.M. et al., "Mixed analytical and numerical design method for piezoelectric transformers", *IEEE,PESX* Jun. 2003, 841-846.

Schuessler, Hans H., "Ceramic Filters and Resonators", *Reprinted from IEEE Trans. Sonics Ultrason.*, vol. SU-21 Oct. 1974, 257-268.

Spangenberg, B. et al., "Dependence of the Layer Resistance of Boron Implantation in Silicon and the Annealing Conditions", *Comptus Rendus de l'Academic Bulgare des Sciences*, vol. 33, No. 3 1980, 325-327.

Tiersten, H. F. et al., "An Analysis of Thiskness-Extensional Trapped Energy Resonant Device Structures with Rectangular Electrodes in the Piezoelectric Thin Film on Silicon Configuration", *J. Appl. Phys.* 54 (10) Oct. 1983, 5893-5910.

Topich, J. A. et al., "Effects of Ion Implanted Flourine in Silicon Dioxide", *Nuclear Instr. and Methods, Cecon Rec*, Cleveland, OH May 1978, 70-73.

Tsubbouchi, K. et al., "Zero Temperature coefficient Surface Acoustic Wave Devices using Epitaxial AlN Films", *IEEE Ultrasonic symposium*, San Diaego, CA, 1082 1982, 240-245.

Vasic, D et al., "A New Method to Design Piezoelectic Transformer Used in MOSFET & IGBT Drive Circuits", *IEEE 34th Anuual Power Electronics Specialists Conference*, 2003 vol. 1 Jun. 15-19, 2003, 307-312.

Vasic, D et al., "A New MOSFET & IGBT Gate Drive Insulated by a Piezoelectric Transformer", *IEEE 32 nd Annual Power Electronics Specilaists Conference*, 2001 vol. 3 2001, 1479-1484.

Yang, C.M. et al., "Highly C Axis Oriented AlN Film Using MOCVD for 5GHx Band FBAR Filter", *2003 IEEE Ultrasonics Symposium* Oct. 5, 2003, pp. 170-173.

Akiyama, et al., "Enhancement of Piezoelectric Response in Scandium Aluminum Nitride Alloy Thin Films Prepared by Dual Reactive Cosputtering", *Adv. Mater* 2009, 593-596.

Bi, F.Z., "Bulk Acoustic Wave RF Technology", *IEEE Microwave Magazine*, vol. 9, Issue 5. 65-80, Oct. 2008.

Chen, "Fabrication and Characterization of ALN Thin Film Bulk Acoustic Wave Resonator", *Dissertation*, University of Pittsburgh School of Engineering 2006.

C-S Lee, et al., "Copper-Airbridged Low-Noise GaAs PHEMT With Ti/WN$_x$/Ti Diffusion Barrier for High-Frequency", *IEEE Transactions on Electron Devices*, vol. 53, Issue: 8. 2006, 1753-1758.

Denisse, C.M.M. et al., "Plasma-Enhanced Growth and Composition of Silicon Oxynitride Films", *J. Appl. Phys.*, vol. 60, No. 7. Oct. 1, 1986, 2536-2542.

Fattinger, G.G. et al., "Single-To-Balance Filters for Mobile Phones Using Coupled Resonator BAW Technology", *2004 IEEE Ultrasonics Symposium* Aug. 2004, 416-419.

Fattinger, G. B. et al., "Spurious Mode Suppression in Coupled Resonator Filters", *IEEE MTT-S International Microwave Symposium Digest* 2005, 409-412.

Gilbert, S. R., "An Ultra-Miniature, Low Cost Single Ended to Differential Filter for ISM Band Applications", *Micro. Symp. Digest, 2008 IEEE MTT-S* Jun. 2008, 839-842.

Grill, A. et al., "Ultralow-K Dielectrics Prepared by Plasma-Enhanced Chemical Vapor Deposition", *App. Phys. Lett*, vol. 79 2001, 803-805.

Jamneala, T. et al., "Coupled Resonator Filter with Single-Layer Acoustic Coupler", *IEEE Transaction on Ultrasonics, Ferroelectrics, and Frequency Control*, vol. 55 Oct. 2008, 2320-2326.

Jamneala, Tiberiu et al., "Ultra-Miniature Coupled Resonator Filter with Single-Layer Scoustic Coupler", *IEEE Transactions on Ultrasonics, Ferroelectrics, and Frequency Control*, vol. 56, No. 11. Nov. 2009, 2553-2558.

Kaitila, J. et al., "Measurement of Acoustical Parameters of Thin Films", *2006 IEEE Ultrasonics Symposium* Oct. 2006, 464-467.

Lee, Jiunn-Homg et al., "Optimization of Frame-Like Film Bulk Acoustic Resonators for Suppression of Spurious Lateral Modes Using Finite Element Method", *IEEE Ultrasonic Symposium*, vol. 1, 2004, 278-281.

Loboda, M. J., "New Solutions for Intermetal Dielectrics Using Trimethylsilane-Based PECVD Processes", *Microelectronics Eng.*, vol. 50. 2000, 15-23.

Martin, et al., "Re-growth of C-Axis Oriented AlN Thin Films", *IEEE Ultrasonics Symposium* 2006, 169-172.

Martin, et al., "Shear Mode Coupling and Tilted Gram Growth of AlN Thin Films in BAW Resonators", *IEEE Transactions on Ultrasonics, Ferroelectrics, and Frequency Control*, vol. 53 No. 7 Jul. 2006, 1339-1343.

Martinez, et al., "High confinement suspended micro-ring resonators in silicon-on-insulator", *Optics Express*, Vo. 14, No. 13 Jun. 26, 2006, 6259-6263.

Merriam-Webswter, , "Collegiate Dictionary", *tenth edition* 2000, 2 pages.

Pandey, et al., "Anchor Loss Reduction in Resonant MEMS using MESA Structures", *Proceedings of the 2nd IEEE International Conference on Nano/Micro Engineered and Molecular Systems*, Bangkok, Thailand Jan. 16-19, 2007, 880-885.

Pensala, et al., "Spurious resonance suppression in gigahertz-range ZnO thin-film bulk acoustic wave resonators by the boundary frame method: modeling and experiment", *IEEE Transactions on Ultrasonics, Ferroelectrics, and Frequency Control*, vol. 56, No. 8 Aug. 2009, 1731-1744.

Pensala, , "Thin film bulk acoustic wave devices: performance optimization and modeling", http://www.vtt.fi/inf/pdf/publications/2011/P756.pdf, presented Feb. 2011.

Schoenholz, J.E. et al., "Plasma-Enhanced Deposition of Silicon Oxynitride Films", *Thin Solid Films* 1987, 285-291.

Shirakawa, A. A. et al., "Bulk Acoustic Wave Coupled Resonator Filters Synthesis Methodology", *2005 European Microwave Conference*, vol. 1 Oct. 2005.

Small, M. K. et al., "A De-Coupled Stacked Bulk Acoustic Resonator (DSBAR) Filter with 2 dB Bandwidth >4%", *2007 IEEE Ultrasonics Symposium* Oct. 2007, 604-607.

Tas, et al., "Reducing Anchor Loss in Micromechanical Extensional Mode Resonators", *IEEE Transactions on Ultrasonics, Ferroelectrics and Frequency Control*, vol. 57, No. 2. Feb. 2010, 448-454.

Thomsen, C. et al., "Surface Generation and Detection of Phonons by Picosecond Light Pulses", *Phys. Rev. B*, vol. 34, Sep. 1986, pp. 4129-4138.

Yanagitani, et al., "Giant Shear Mode Electromechanical Coupling Coefficient k15 in C-Axis Tilted ScAIN Films", *IEEE International Ultrasonics Symposium* 2010.

* cited by examiner

ACOUSTIC RESONATOR STRUCTURE COMPRISING A BRIDGE

BACKGROUND

In many electronic applications, electrical resonators are used. For example, in many wireless communications devices, radio frequency (rf) and microwave frequency resonators are used as filters to improve reception and transmission of signals. Filters typically include inductors and capacitors, and more recently, resonators.

As will be appreciated, it is desirable to reduce the size of components of electronic devices. Many known filter technologies present a barrier to overall system miniaturization. With the need to reduce component size, a class of resonators based on the piezoelectric effect has emerged. In piezoelectric-based resonators, acoustic resonant modes are generated in the piezoelectric material. These acoustic waves are converted into electrical waves for use in electrical applications.

One type of piezoelectric resonator is a Film Bulk Acoustic Resonator (FBAR). The FBAR has the advantage of small size and lends itself to Integrated Circuit (IC) manufacturing tools and techniques. The FBAR includes an acoustic stack comprising, inter alia, a layer of piezoelectric material disposed between two electrodes. Acoustic waves achieve resonance across the acoustic stack, with the resonant frequency of the waves being determined by the materials in the acoustic stack.

FBARs are similar in principle to bulk acoustic resonators such as quartz, but are scaled down to resonate at GHz frequencies. Because the FBARs have thicknesses on the order of microns and length and width dimensions of hundreds of microns. FBARs beneficially provide a comparatively compact alternative to known resonators.

Desirably, the bulk acoustic resonator excites only thickness-extensional (TE) modes, which are longitudinal mechanical waves having propagation (k) vectors in the direction of propagation. The TE modes desirably travel in the direction of the thickness (e.g., z-direction) of the piezoelectric layer.

Unfortunately, besides the desired TE modes there are lateral modes, known as Rayleigh-Lamb modes, generated in the acoustic stack as well. The Rayleigh-Lamb modes are mechanical waves having k-vectors that are perpendicular to the direction of TE modes, the desired modes of operation. These lateral modes travel in the areal dimensions (x, y directions of the present example) of the piezoelectric material. Among other adverse effects, lateral modes deleteriously impact the quality (Q) factor of an FBAR device. In particular, the energy of Rayleigh-Lamb modes is lost at the interfaces of the FBAR device. As will be appreciated, this loss of energy to spurious modes is a loss in energy of desired longitudinal modes, and ultimately a degradation of the Q-factor.

FBARs comprise an active area, and connections to and from the active area can increase losses, and thereby degrade the Q factor. For example, in transition regions between the active area and the connections, defects may form in the piezoelectric layer during fabrication. These defects can result in acoustic loss, and as a result, a reduction in the Q factor.

What is needed, therefore, are an acoustic resonator structure and electrical filter that overcomes at least the known shortcomings described above.

SUMMARY

In accordance with a representative embodiment, an acoustic resonator comprises: a first electrode; a second electrode; a piezoelectric layer disposed between the first and second electrodes; and a reflective element disposed beneath the first electrode, the second electrode and the piezoelectric layer. An overlap of the reflective element, the first electrode, the second electrode and the piezoelectric layer defines an active area of the acoustic resonator. The first electrode substantially covers the reflective element, and the piezoelectric layer extends over an edge of the first electrode. The acoustic resonator also comprises a bridge adjacent to a termination of the active area of the acoustic resonator, and the bridge overlaps a portion of the first electrode.

In accordance with another representative embodiment, a film bulk acoustic resonator (FBAR) comprises: a first electrode; a second electrode; a piezoelectric layer disposed between the first and second electrodes; and a cavity disposed beneath the first electrode, the second electrode and the piezoelectric layer. An overlap of the cavity, the first electrode, the second electrode and the piezoelectric layer defines an active area of the acoustic resonator. The first electrode substantially covers the cavity, and the piezoelectric layer extends over an edge of the first electrode. The FBAR also comprises a bridge adjacent to a termination of the active area of the acoustic resonator. The bridge overlaps a portion of the first electrode.

In accordance with yet another representative embodiment, a filter element comprises an acoustic resonator. The acoustic resonator comprises: a first electrode; a second electrode; a piezoelectric layer disposed between the first and second electrodes; and a reflective element disposed beneath the first electrode, the second electrode and the piezoelectric layer. An overlap of the reflective element, the first electrode, the second electrode and the piezoelectric layer defines an active area of the acoustic resonator. The first electrode substantially covers the reflective element, and the piezoelectric layer extends over an edge of the first electrode. The acoustic resonator also comprises a bridge adjacent to a termination of the active area of the acoustic resonator, and the bridge overlaps a portion of the first electrode.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DEFINED TERMINOLOGY

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to within acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

DETAILED DESCRIPTION

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the illustrative embodiments. Such methods and apparati are clearly within the scope of the present teachings.

Figure 1:
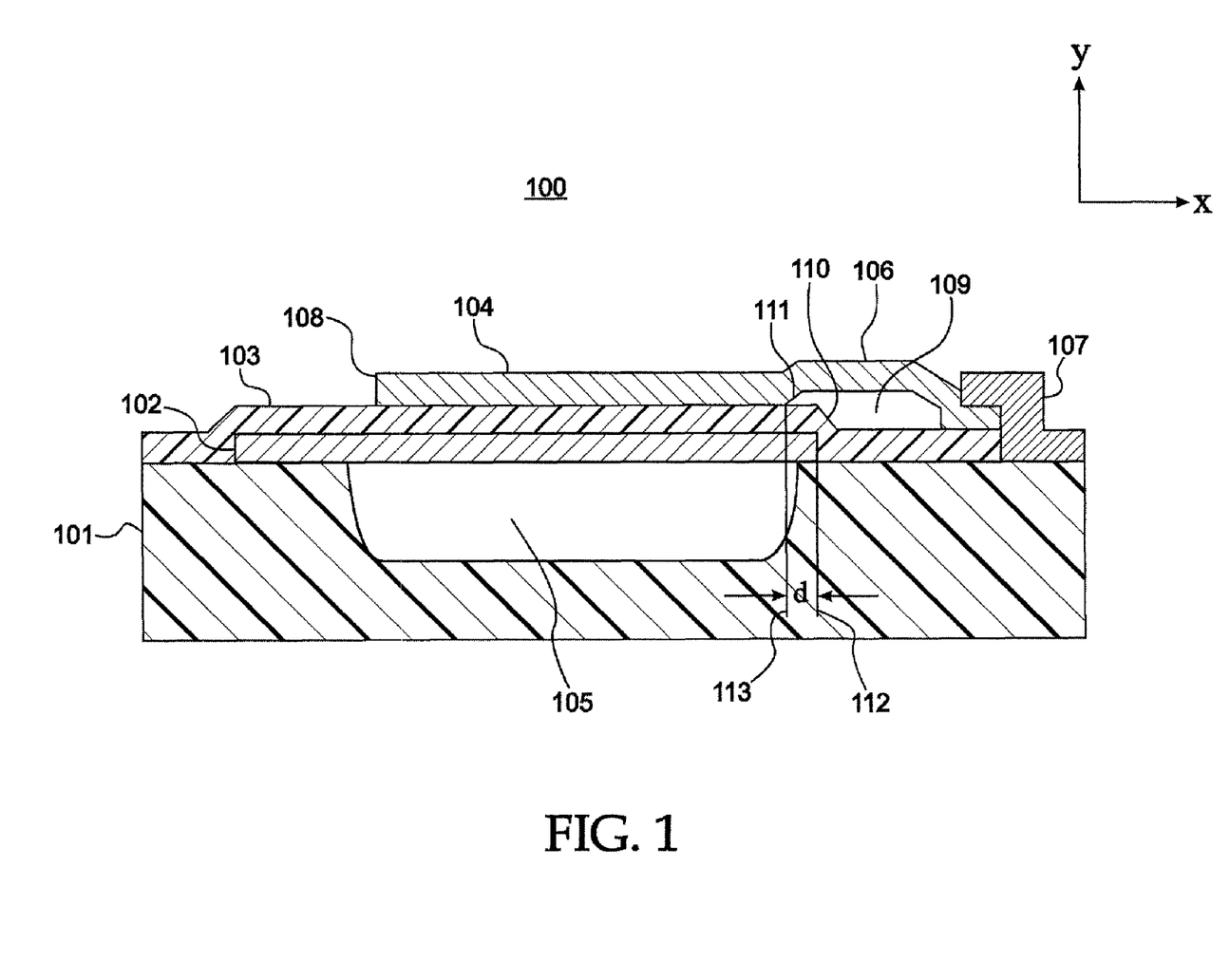
FIG. 1 shows a cross-sectional view of an acoustic resonator in accordance with a representative embodiment.

FIG. 1 is a cross-sectional view of an acoustic resonator 100 in accordance with an illustrative embodiment. Illustratively, the acoustic resonator 100 is an FBAR structure. The acoustic resonator 100 comprises a substrate 101. A first electrode 102 is disposed over the substrate 101. A piezoelectric layer 103 is disposed over the first electrode 102. A second electrode 104 is disposed over the first electrode 102. The piezoelectric layer 103 has a first surface in contact with the first electrode 102 and a second surface in contact with the second electrode 104. The first and second electrodes 102, 104 include an electrically conductive material and provide an oscillating electric field in the y-direction, which is the direction of the thickness of the piezoelectric layer 103. In the present illustrative embodiment, the y-axis is the axis for the TE (longitudinal) mode(s) for the resonator.

The piezoelectric layer 103 and first and second electrodes 102, 104 are suspended over a cavity 105 formed by selective etching of the substrate 101. The cavity 105 may be formed by a number of known methods, for example as described in commonly assigned U.S. Pat. No. 6,384,697 to Ruby, et al. The region of overlap of the first and second electrodes 102, 104, the piezoelectric layer 103 and the cavity 105 is referred to as the active area of the acoustic resonator 100. Accordingly, the acoustic resonator 100 is a mechanical resonator, which can be electrically coupled via the piezoelectric layer 103. Other suspension schemes that foster mechanical resonance by FBARs are contemplated. For example, the acoustic resonator 100 can be located over a mismatched acoustic Bragg reflector (not shown) formed in or on the substrate 101. This type of FBAR is sometimes referred to as a solid mount resonator (SMR) and, for example, may be as described in U.S. Pat. No. 6,107,721 to Lakin, the disclosure of which is specifically incorporated into this disclosure by reference in its entirety.

By contrast, an inactive area of the acoustic resonator 100 comprises a region of overlap between first electrode 102, or second electrode 104, or both, and the piezoelectric layer 103 not disposed over the cavity 105 or other suspension structure. As described more fully below, it is beneficial to the performance of the resonator to reduce the area of the inactive region of the acoustic resonator 100 to the extent practical.

When connected in a selected topology, a plurality of acoustic resonators 100 can act as an electrical filter. For example, the acoustic resonators 100 may be arranged in a ladder-filter arrangement, such as described in U.S. Pat. No. 5,910,756 to Ella, and U.S. Pat. No. 6,262,637 to Bradley, et al. The electrical filters may be used in a number of applications, such as in duplexers.

The acoustic resonator 100 may be fabricated according to known semiconductor processing methods and using known materials. Illustratively, the acoustic resonator 100 may be fabricated according to the teachings of U.S. Pat. Nos. 5,587,620; 5,873,153; 6,384,697; 6,507,983; and 7,275,292 to Ruby, et al.; and 6,828,713 to Bradley, et. al. The disclosures of these patents are specifically incorporated herein by reference. It is emphasized that the methods and materials described in these patents are representative and other methods of fabrication and materials within the purview of one of ordinary skill in the art are contemplated.

The acoustic resonator 100 also comprises a bridge 106 provided on a side of the acoustic resonator 100 that connects to a contact 107. The contact 107 is connected to a signal line (not shown) and electronic components (not shown) are selected for the particular application of the acoustic resonator 100. This portion of the acoustic resonator 100 is often referred to as the interconnection side of the acoustic resonator 100. By contrast, the second electrode 104 terminates at a position 108 over the cavity 105 in order to minimize the inactive area of the acoustic resonator 100 as described below. The position 108 opposes the interconnection side of the acoustic resonator 100.

The bridge 106 comprises a gap 109 formed beneath a portion of the second electrode 104. Illustratively, and as described below, after removal of a sacrificial layer (not shown) provided in the formation of the gap 109, the gap 109 comprises air. However, the gap 109 may comprise other materials including low acoustic impedance materials, such as carbon (C) doped $SiO_2$, which is also referred as Black-diamond; or dielectric resin commercially known as SiLK; or benzocyclobutene (BCB). Such low acoustic impedance materials may be provided in the gap 109 by known methods. The low acoustic impedance material may be provided after removal of sacrificial material used to form the gap 109 (as described below), or may be used instead of the sacrificial material in the gap 109, and not removed.

In a representative embodiment, the bridge 106 is formed by providing a sacrificial layer (not shown) over the first electrode 102 and a portion of the piezoelectric layer 103 on the interconnection side and forming the second electrode 104 over the sacrificial layer. Illustratively, the sacrificial material comprises phosphosilicate glass (PSG), which illustratively comprises 8% phosphorous and 92% silicon dioxide. Subsequent layers such as the piezoelectric layer 103 and the second electrode 104 are deposited, sequentially, upon the PSG until the final structure is developed. Notably a seed layer (not shown) may be provided over the first electrode 102 before depositing the piezoelectric layer 103, and a passivation layer (not shown) may be deposited over the second electrode 104. After the formation of the structure comprising the bridge 106, the PSG sacrificial layer is etched away illustratively with hydrofluoric acid leaving the free-standing bridge 106. In a representative embodiment, the sacrificial layer disposed in the cavity 105 and the sacrificial layer beneath the bridge 106 are removed in the same process step, with the latter leaving the gap 109 comprising air.

The piezoelectric layer 103 comprises a transition 110 formed during the formation of the piezoelectric layer 103 over the first electrode 102 and the substrate 101. The piezoelectric layer 103 at the transition 110 often comprises material defects and voids, particularly structural defects such as lattice defects and voids. These defects and voids can result in losses of acoustic energy of the mechanical waves propagating in the piezoelectric material. As should be appreciated, acoustic energy loss results in a reduction in the Q-factor of the acoustic resonator 100. However, and as described below, by separating the second electrode 104 from the piezoelectric layer 103 in a region 111 of the gap 109 where the transition 110 occurs, the portion of the active region of the acoustic resonator 100 necessarily does not include the transition 110 of the piezoelectric layer 103 that includes the defects and voids therein. As a result, acoustic losses due to the defects and voids in the piezoelectric layer 103 at the transition 110 are reduced and the Q-factor is improved compared to known resonators, such as known FBARs.

Additionally, and beneficially, the bridge 106 provides an acoustic impedance mismatch at the boundary of the active region on the interconnection side of the acoustic resonator 100. This acoustic impedance mismatch results in the reflection of acoustic waves at the boundary that may otherwise propagate out of the active region and be lost, resulting in energy loss. By preventing such losses, the bridge 106 results in an increased Q-factor in the acoustic resonator 100. Moreover, the termination of the second electrode 104 at position 108 terminates the active region of the acoustic resonator 100 and reduces losses by creating an acoustic impedance mismatch. This also provides an improvement in the Q-factor.

In addition to terminating the active region of the acoustic resonator 100 before the transition 110, the bridge 106 also reduces the area of an inactive region of the acoustic resonator 100. The inactive region of the FBAR 100 creates a parasitic capacitance, which in an equivalent circuit is electrically in parallel with the intrinsic capacitance of the active region of the FBAR. This parasitic capacitance degrades the effective coupling coefficient ($kt^2$), and therefore it is beneficial to reduce the parasitic capacitance. Reducing the area of the inactive region reduces the parasitic capacitance, and thereby improves the effective coupling coefficient ($kt^2$).

FIG. 1 also shows a first line 112 and a second line 113 separated by a distance 'd.' The distance 'd' represents the distance between the edge of the first electrode 102 at the first line 112 (arbitrarily selected as x=0 for this discussion) to the beginning point of the bridge 106 at the second line 113. As the position of the second line 113 becomes larger (more negative), the Q-factor increases. The effective coupling coefficient ($kt^2$) also increases with separation of first and second lines 112, 113 to an extent. Thus, the selection of a particular distance 'd' results in an improvement in Q due to reduced acoustic losses due to the reduction in the inactive FBAR area and the improvement in $kt^2$ from the reduction of the parasitic capacitance.

Figure 2:
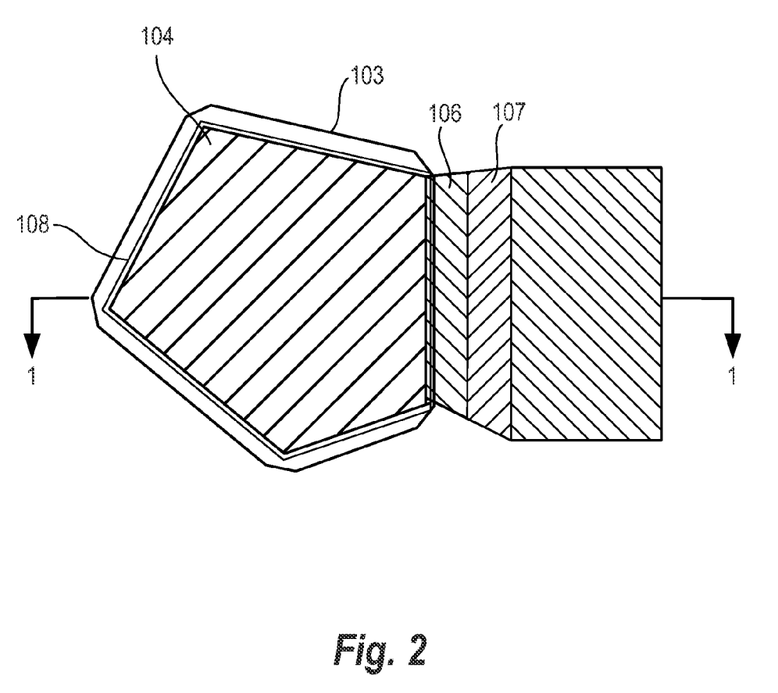
FIG. 2 shows a top view of an acoustic resonator in accordance with a representative embodiment.

FIG. 2 shows a top view of the acoustic resonator 100 of FIG. 1. Notably, the cross-sectional view of the acoustic resonator 100 shown in FIG. 1 is taken along the line 1-1. The second electrode 104 of the present embodiment is apodized to reduce acoustic losses. Further details of the use of apodization in acoustic resonators may be found in commonly owned U.S. Pat. No. 6,215,375 to Larson III, et al; or in commonly owned U.S. Pat. No. 7,629,865 entitled "Piezoelectric Resonator Structures and Electrical Filters" filed May 31, 2006, to Richard C. Ruby. The disclosures of U.S. Pat. Nos. 6,215,375 and 7,629,865 are specifically incorporated herein by reference in their entirety.

The fundamental mode of the acoustic resonator 100 is the longitudinal extension mode or "piston" mode. This mode is excited by the application of a time-varying voltage to the two electrodes at the resonant frequency of the acoustic resonator 100. The piezoelectric material converts energy in the form of electrical energy into mechanical energy. In an ideal FBAR having infinitesimally thin electrodes, resonance occurs when the applied frequency is equal to the velocity of sound of the piezoelectric medium divided by twice the thickness of the piezoelectric medium: $f=v_{ac}(2*T)$, where T is the thickness of the piezoelectric medium and $v_{ac}$ is the acoustic phase velocity. For resonators with finite thickness electrodes, this equation is modified by the weighted acoustic velocities and thicknesses of the electrodes.

A quantitative and qualitative understanding of the Q of a resonator may be obtained by plotting on a Smith Chart the ratio of the reflected energy to applied energy as the frequency is varied for the case in which one electrode is connected to ground and another to signal, for an FBAR resonator with an impedance equal to the system impedance at the resonant frequency. As the frequency of the applied energy is increased, the magnitude/phase of the FBAR resonator sweeps out a circle on the Smith Chart. This is referred to as the Q-circle. Where the Q-circle first crosses the real axes (horizontal axes), this corresponds to the series resonance frequency $f_s$. The real impedance (as measured in Ohms) is $R_s$. As the Q-circle continues around the perimeter of the Smith chart, it again crosses the real axes. The second point at which the Q circle crosses the real axis is labeled $f_p$, the parallel or anti-resonant frequency of the FBAR. The real impedance at $f_p$ is $R_p$.

Often it is desirable to minimize $R_s$ while maximizing $R_p$. Qualitatively, the closer the Q-circle "hugs" the outer rim of the Smith chart, the higher the Q-factor of the device. The Q-circle of an ideal lossless resonator would have a radius of one and would be at the edge of the Smith chart. However, as noted above, there are energy losses that impact the Q of the device. For instance, and in addition to the sources of acoustic losses mentioned above, Rayleigh-Lamb (lateral or spurious) modes are in the x,y dimensions of the piezoelectric layer 103. These lateral modes are due to interfacial mode conversion of the longitudinal mode traveling in the z-direction; and due to the creation of non-zero propagation vectors, $k_x$ and $k_y$, for both the TE mode and the various lateral modes (e.g., the S0 mode and the zeroth and first flexure modes, A0 and A1), which are due to the difference in effective velocities between the regions where electrodes are disposed and the surrounding regions of the resonator where there are no electrodes.

Regardless of their source, the lateral modes are parasitic in many resonator applications. For example, the parasitic lateral modes couple at the interfaces of the resonator and remove energy available for the longitudinal modes and thereby reduce the Q-factor of the resonator device. Notably, as a result of parasitic lateral modes and other acoustic losses sharp reductions in Q can be observed on a Q-circle of the Smith Chart of the $S_{11}$ parameter. These sharp reductions in Q-factor are known as "rattles" or "loop-de-loops," which are shown and described in commonly owned U.S. Pat. No. 7,280,007, referenced below.

As described more fully in U.S. Pat. Nos. 6,215,375 and 7,629,865, the apodized first and second electrodes 102, 104 cause reflections of the lateral modes at the interfaces of the resonator to interfere non-constructively, and therefore reduce the magnitude of lateral modes which otherwise result in more viscous energy dissipation. Beneficially, because these lateral modes are not coupled out of the resonator and developed to higher magnitude, energy loss can be mitigated with at least a portion of the reflected lateral modes being converted to longitudinal modes through mode conversion. Ultimately, this results in an overall improvement in the Q-factor.

Figure 3:
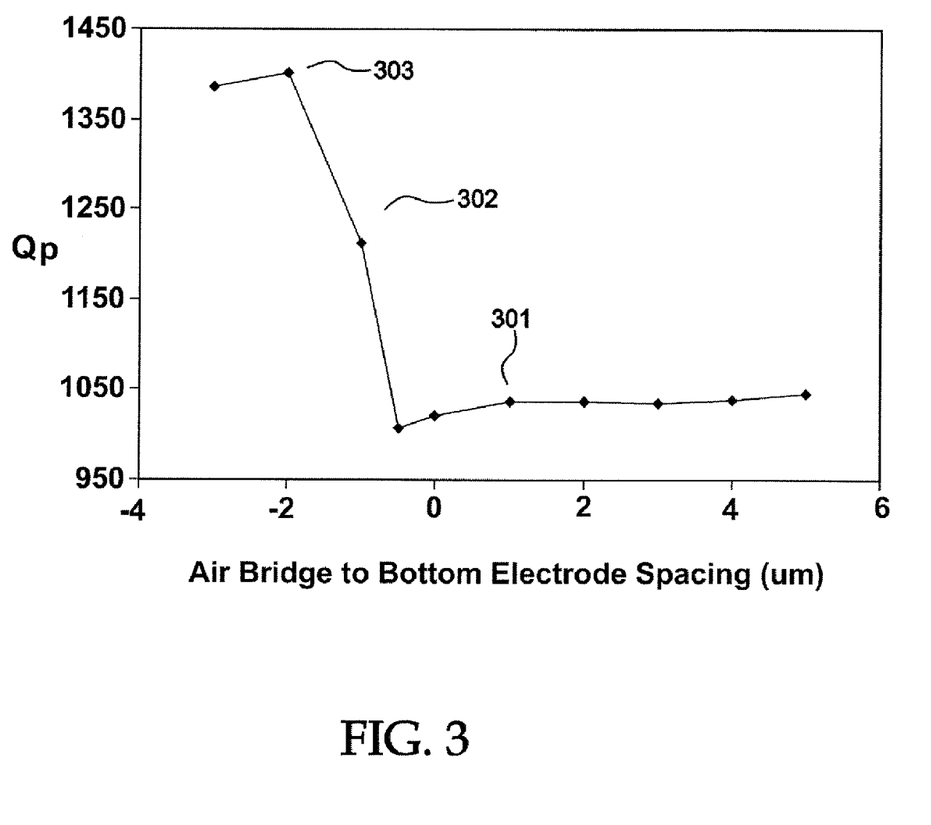
FIG. 3 shows a graph of the Q-factor versus a spacing between the air-bridge and the lower electrode of an FBAR in accordance with a representative embodiment.

FIG. 3 shows a graph of the Q-factor versus a spacing ('d' in FIG. 1) between the bridge 106 and the first electrode 102 of acoustic resonator 100 in accordance with a representative embodiment. When the spacing 'd' is selected to be zero, second line 113 is aligned with first line 112, and the region 111 is eliminated. When the spacing 'd' is selected to be positive, the second line 113 now has a positive x-coordinate (i.e., second line 113 is located to the right of first line 112 in FIG. 1). In either case, the acoustic losses due to defects in the transition 110 and a comparative increase in the area of the inactive region of the acoustic resonator 100 combine to result in a Q-factor that is comparatively low. By contrast, when the spacing d is selected to be 'negative' the inactive area is decreased (i.e., second line 113 is located to the left of first line 112 in FIG. 1), with the bridge 106 and region 111 comprising a comparatively increased dimension. As can be seen in region 302 of FIG. 3, the Q-factor increases to a maximum value at 303. As should be appreciated, the reduction in the inactive area of the acoustic resonator 100 on the interconnection side of the acoustic resonator 100, and the forming of the region 111 results in a decrease in losses due to defects and an acoustic impedance mismatch at the boundary of the active region of the acoustic resonator 100 at the interconnection side of the acoustic resonator 100.

Figure 4:
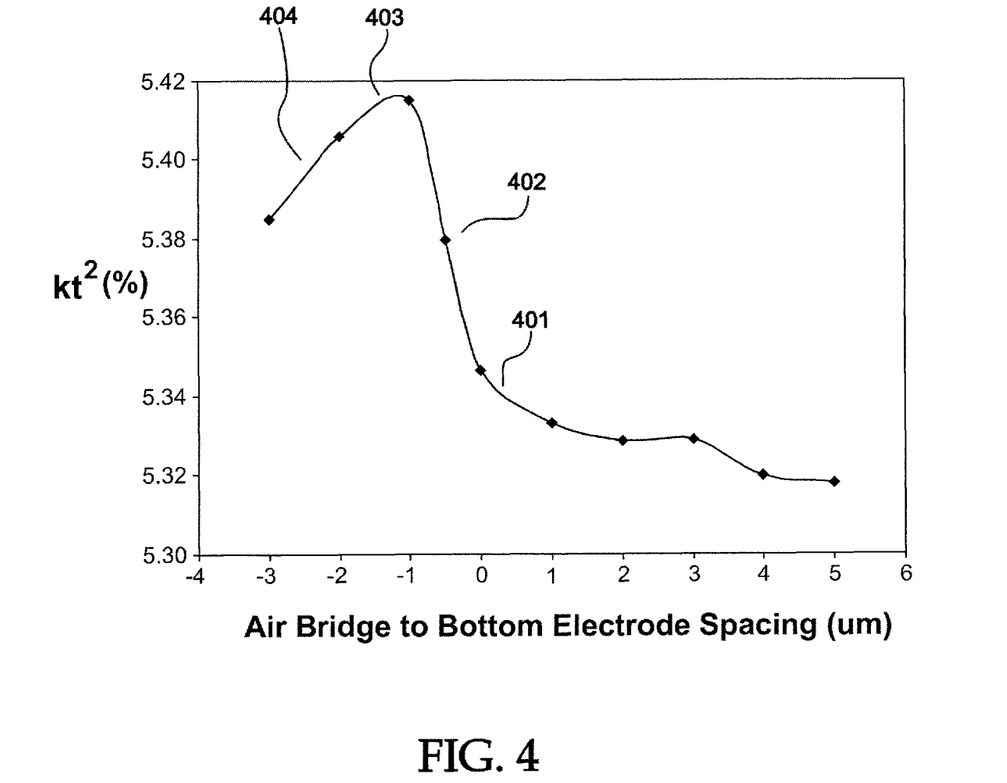
FIG. 4 shows a graph of the effective coupling coefficient ($kt^2$) versus a spacing between the air-bridge and the lower electrode of an acoustic resonator in accordance with a representative embodiment.

FIG. 4 shows a graph of the effective coupling coefficient ($kt^2$) versus a spacing ('d' in FIG. 1) between the air-bridge (e.g., 106) and the lower electrode (e.g., 102) of an acoustic resonator 100 in accordance with a representative embodiment. When the spacing is selected to be zero, second line 113 is aligned with first line 112 and the region 111 is eliminated. When the spacing 'd' is selected to be positive, the second line 113 now has a positive x-coordinate (i.e., second line 113 is to the right of first line 112 in FIG. 1). In either case, the area of the inactive region results in an increase in the parasitic capacitance. This increased parasitic capacitance provides a comparatively reduced effective coupling coefficient ($kt^2$) as shown in region 401 of FIG. 4. By contrast, when the spacing d is selected to be 'negative' (i.e., second line 113 is to the left of first line 112 in FIG. 1) the inactive area is decreased, with the bridge 106 and region 111 increasing in dimension. This results in a reduction in the parasitic capacitance, and a comparative increase in the effective coupling coefficient ($kt^2$) as shown in region 402 of FIG. 4. A maximum value of the effective coupling coefficient ($kt^2$) is reached at 403 in FIG. 4. In region 404 of FIG. 4, the effective coupling coefficient ($kt^2$) begins to drop. Likely, this is due to the fact that region 111 further increases over cavity 105, resulting in an increase in the area of the parasitic capacitor formed by the bridge 106 and the gap 109, thus increasing the parasitic capacitance in parallel with the intrinsic capacitance of the acoustic resonator 100. Moreover, as region 111 increases within cavity 105, the active resonator area also decreases, resulting in a decrease in $kt^2$. Accordingly, in region 404, the effective coupling coefficient ($kt^2$) decreases as region 111 increases. As should be appreciated from the discussion of FIGS. 3 and 4, the selection of the distance 'd' in FIG. 1 allows for the selection of an acceptable increase in both the Q-factor and the effective coupling coefficient ($kt^2$).

Figure 5:
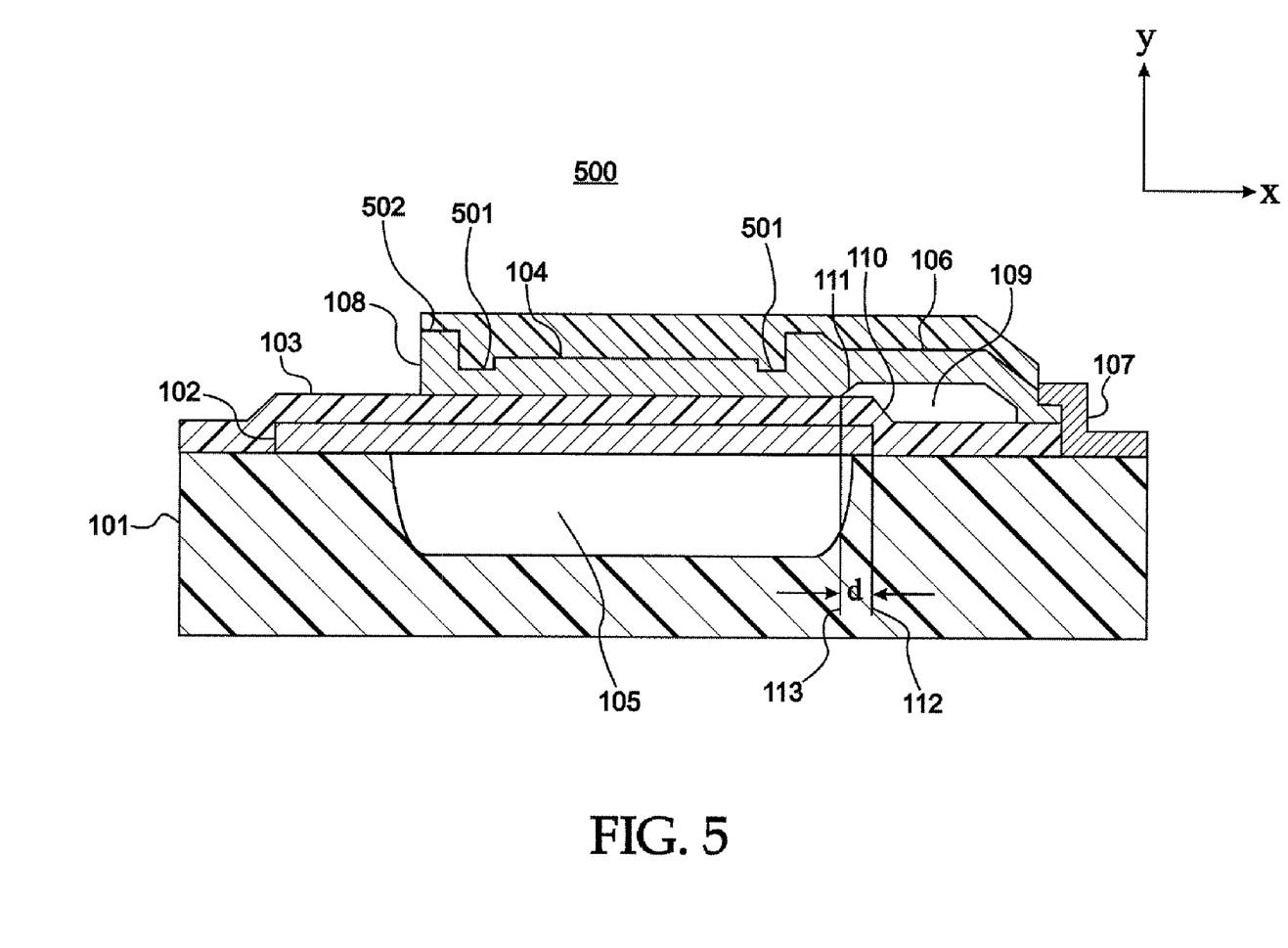
FIG. 5 shows a cross-sectional view of an FBAR in accordance with a representative embodiment.

FIG. 5 is a cross-sectional view of an acoustic resonator 500 in accordance with an illustrative embodiment. The acoustic resonator 500, which is illustratively an FBAR, shares many common features with the acoustic resonator 100 described previously. Many of these common details are not repeated in order to avoid obscuring the presently described embodiments.

The acoustic resonator 500 comprises a selective recess 501 (often referred to as an 'innie') and a frame element 502 (also referred to as an 'outie'). The recess 501 and frame element 502 provide an acoustic mismatch at the perimeter of the second electrode 104, improve signal reflections and reduce acoustic losses. Ultimately, reduced losses translate into an improved Q-factor of the device. While the recess 501 and the frame element 502 are shown on the second electrode 104, these features may instead be provided on the first electrode 102, or selectively on both the first and second electrodes 102,104. Further details of the use, formation and benefits of the recess 501 and the frame element 502 are found for example, in commonly owned U.S. Pat. No. 7,280,007 entitled "Thin Film Bulk Acoustic Resonator with a Mass Loaded Perimeter" to Feng, et al.; and commonly owned U.S. Patent Application Publication 20070205850 entitled "Piezoelectric Resonator Structure and Electronic Filters having Frame Elements" to Jamneala, et al. The disclosures of this patent and patent application publication are specifically incorporated herein by reference.

Figure 6:
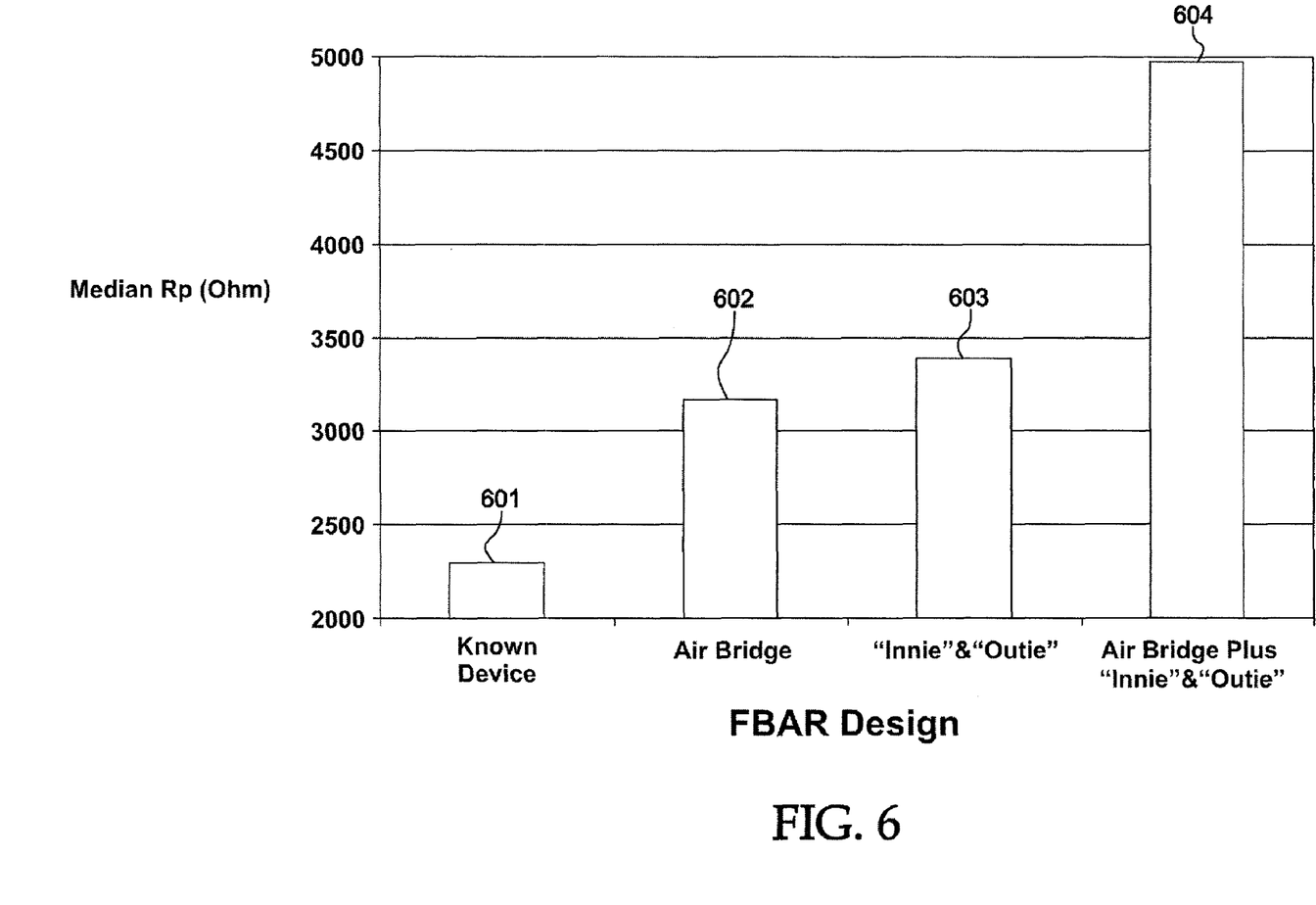
FIG. 6 shows a graph of the parallel impedance (Rp) for FBARs, including certain FBARs of representative embodiments.

FIG. 6 shows a graph of the impedance Rp at parallel resonance for FBARs, including certain acoustic resonators of representative embodiments. Notably, Rp of a known resonator is shown at 601; Rp of an acoustic resonator comprising the bridge 106 (e.g., acoustic resonator 100 of FIG. 1) is shown at 602; Rp of an acoustic resonator comprising recesses and frame elements (with no bridge) is shown at 603; and Rp of an acoustic resonator comprising both the bridge 106, and the recess 501 and the frame element 502 (e.g., acoustic resonator 500 of FIG. 5) is shown at 604.

The known resonator typically has Rp (shown at 601) of approximately 2000 Ohm. The addition of a recess and a frame element in a known FBAR increases Rp by approximately 1 kΩ as shown at 602. Similarly, the addition of the bridge 106 but not the recess 501 and or the frame element 502 increases Rp by approximately 1 kΩ as shown at 603. However, when adding combined features of the bridge 106 and the recess 501 and frame element 502, the overall parallel resonance Rp improves by nearly 3 kΩ (over that of the known resonator) as shown at 604. Accordingly, the bridge 106, and the recess 501 and frame element 502 provide a synergistic increase in the parallel resonance Rp, as is evident by a comparison of 601 and 604 in FIG. 6. It is beneficial to have comparatively high Rp in FBARs to provide comparatively low insertion loss and comparatively 'fast' roll off filters comprising such FBARs.

As is known, although the use of recesses such as recess 501 results in a comparatively small increase in the effective coupling coefficient ($kt^2$), there can be a degradation in the effective coupling coefficient ($kt^2$) as a result of the frame elements and recesses. In some applications, it may be useful to mitigate this degradation, even though the improvement in the Q-factor may not be as great. For instance, it is known that the bandwidth of an FBAR filter is related to $kt^2$. As such, a degradation of $kt^2$ can reduce the bandwidth of the FBAR filter. Certain representative embodiments described presently provide somewhat of a trade-off of an acceptable Q-factor and an acceptable degradation of $kt^2$.

Figure 7:
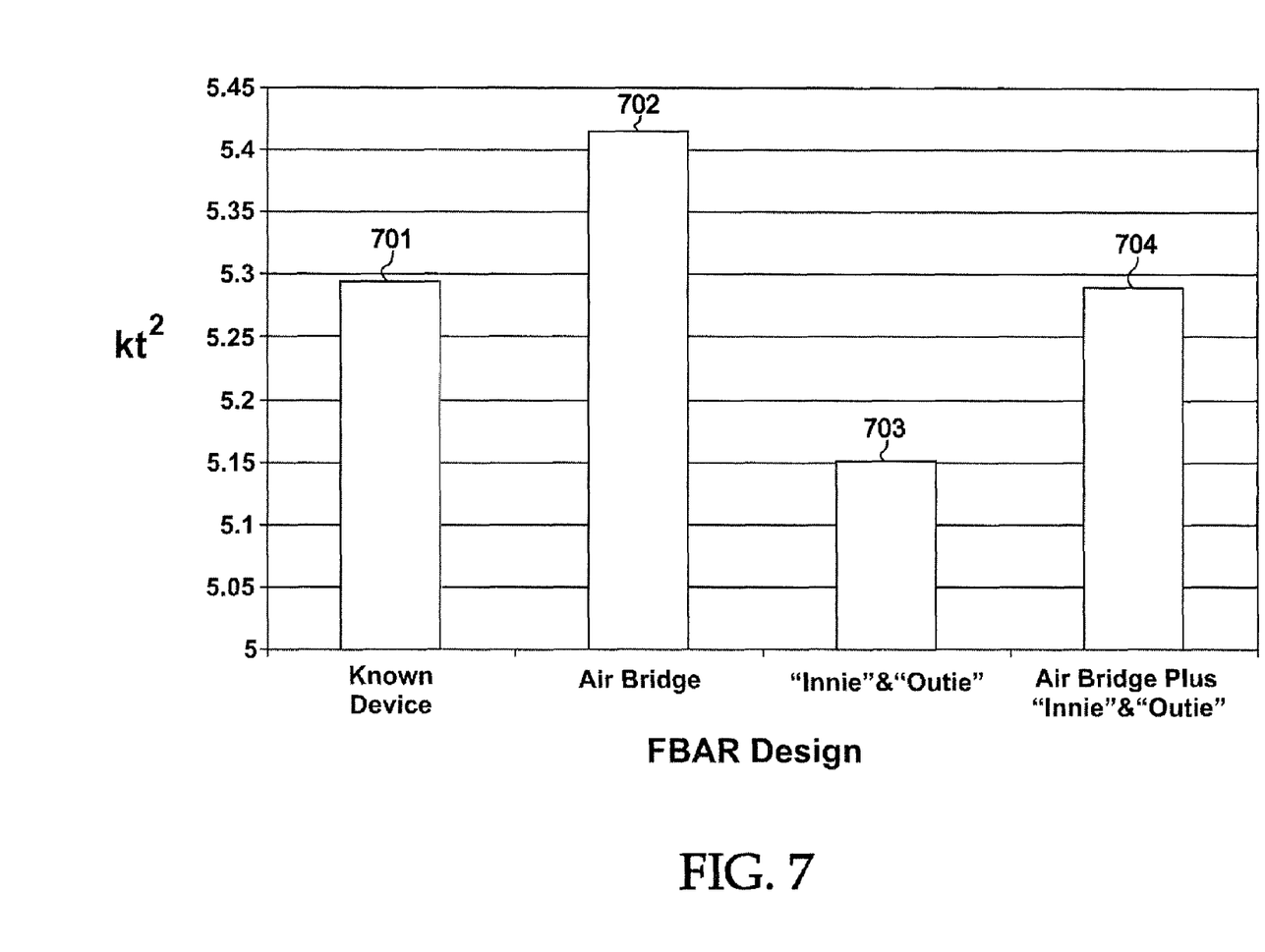
FIG. 7 shows a graph of the effective coupling coefficient ($kt^2$) for FBARs, including certain FBARs of representative embodiments.

FIG. 7 shows a graph of the effective coupling coefficient ($kt^2$) for FBARs, including certain acoustic resonators of representative embodiments. The effective coupling coefficient ($kt^2$) of a known resonator is shown at 701; the effective coupling coefficient ($kt^2$) of an acoustic resonator comprising bridge 106 (e.g., acoustic resonator 100 of FIG. 1) is shown at 702; the effective coupling coefficient ($kt^2$) a known acoustic resonator comprising a recess and a frame element (but with no bridge) is shown at 703; and the effective coupling coefficient ($kt^2$) of an acoustic resonator comprising both a bridge 106, and the recess 501 and the frame element 502 (e.g., acoustic resonator 500 of FIG. 5) is shown at 704.

The effective coupling coefficient ($kt^2$) of the known resonator is approximately 5.3 as shown at 701. The addition of the bridge 106 improves the effective coupling coefficient ($kt^2$) to 5.4 as shown at 702. However, adding recesses and frame elements and no airbridge will result in an effective coupling coefficient ($kt^2$) of approximately 5.15 as shown at 703. Finally, incorporating the bridge 106, the recess 501 and the frame element 502 result in an effective coupling coefficient ($kt^2$) (shown at 704) that is substantially the same as the known FBAR. Thus, the positive impact on the effective coupling coefficient ($kt^2$) from the bridge 106 must be contrasted with the negative impact of recesses and frame elements on the effective coupling coefficient ($kt^2$).

In accordance with illustrative embodiments, acoustic resonators for various applications such as in electrical filters are described having a bridge. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. An acoustic resonator, comprising:
 a first electrode;
 a second electrode;
 a piezoelectric layer disposed between the first and second electrodes;
 a reflective element disposed beneath the first electrode, the second electrode and the piezoelectric layer, an overlap of the reflective element, the first electrode, the second electrode and the piezoelectric layer defining an active area of the acoustic resonator, wherein the first electrode substantially covers the reflective element, and the piezoelectric layer extends over an edge of the first electrode; and
 a bridge adjacent to a termination of the active area of the acoustic resonator, wherein the bridge overlaps a portion of the first electrode.

2. An acoustic resonator as claimed in claim 1, further comprising an electrical connection to one of a plurality of sides of the second electrode, wherein the bridge is disposed between the connection and the one side of the second electrode.

3. An acoustic resonator as claimed in claim 1, wherein adjacent to termination of the active area of the acoustic resonator, the piezoelectric layer comprises a transition comprising defects.

4. An acoustic resonator as claimed in claim 3, wherein the second electrode does not contact the transition.

5. An acoustic resonator as claimed in claim 1, wherein the bridge comprises a gap.

6. An acoustic resonator as claimed in claim 5, wherein the gap comprises a region between the second electrode and the piezoelectric layer.

7. An acoustic resonator as claimed in claim 6, wherein adjacent to termination of the active area of the acoustic resonator, the piezoelectric layer comprises a transition comprising defects, and the transition is disposed beneath the region of the gap.

8. An acoustic resonator as claimed in claim 1, wherein the second electrode comprises an upper surface with a side and a recess is disposed along the side.

9. An acoustic resonator as claimed in claim 1, wherein the second electrode comprises an upper surface with a side, and a frame element is disposed along the side.

10. A film bulk acoustic resonator (FBAR), comprising:
 a first electrode;
 a second electrode;
 a piezoelectric layer disposed between the first and second electrodes;
 a cavity disposed beneath the first electrode, the second electrode and the piezoelectric layer, an overlap of the cavity, the first electrode, the second electrode and the piezoelectric layer defining an active area of the acoustic resonator, wherein the first electrode substantially covers the cavity, and the piezoelectric layer extends over an edge of the first electrode; and
 a bridge adjacent to a termination of the active area of the acoustic resonator, wherein the bridge overlaps a portion of the first electrode.

11. An FBAR as claimed in claim 10, further comprising an electrical connection to one of a plurality of sides of the second electrode, wherein the bridge is disposed between the connection and the one side of the second electrode.

12. An FBAR as claimed in claim 10, wherein adjacent to termination of the active area of the acoustic resonator, the piezoelectric layer comprises a transition comprising defects.

13. An FBAR as claimed in claim 12, wherein the second electrode does not contact the transition.

14. An FBAR as claimed in claim 10, wherein the bridge comprises a gap.

15. An FBAR as claimed in claim 14, wherein the gap comprises a region between the second electrode and the piezoelectric layer.

16. An FBAR as claimed in claim 15, wherein adjacent to termination of the active area of the acoustic resonator, the piezoelectric layer comprises a transition comprising defects, and the transition is disposed beneath the region of the gap.

17. An FBAR as claimed in claim 10, wherein the second electrode comprises an upper surface with a side and a recess is disposed along the side.

18. An FBAR as claimed in claim 10, wherein the second electrode comprises an upper surface with a side, and a frame element is disposed along the side.

19. An FBAR as claimed in claim 10, further comprising a low acoustic impedance material beneath the bridge.

20. A filter element comprising an acoustic resonator, the acoustic resonator comprising:
 a first electrode;
 a second electrode;
 a piezoelectric layer disposed between the first and second electrodes;
 a reflective element disposed beneath the first electrode, the second electrode and the piezoelectric layer, an overlap of the reflective element, the first electrode, the second electrode and the piezoelectric layer defining an active area of the acoustic resonator, wherein the first electrode substantially covers the reflective element, and the piezoelectric layer extends over an edge of the first electrode; and a bridge adjacent to a termination of the active area of the acoustic resonator, wherein the bridge overlaps a portion of the first electrode.

* * * * *